(12) United States Patent
Wang et al.

(10) Patent No.: US 10,275,017 B2
(45) Date of Patent: Apr. 30, 2019

(54) POWER CIRCUIT AND MEMORY DEVICE USING THE SAME

(71) Applicant: Nuvoton Technology Corporation, Hsinchu (TW)

(72) Inventors: Cheng-Chih Wang, Hsinchu (TW); Hsi-Jung Tsai, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/871,022

(22) Filed: Jan. 14, 2018

(65) Prior Publication Data

US 2018/0210540 A1 Jul. 26, 2018

(30) Foreign Application Priority Data

Jan. 25, 2017 (TW) .............................. 106102873 A

(51) Int. Cl.
| | | |
|---|---|---|
| *G06F 1/32* | (2019.01) | |
| *G05F 1/575* | (2006.01) | |
| *G11C 16/10* | (2006.01) | |
| *G11C 16/30* | (2006.01) | |
| *G11C 5/14* | (2006.01) | |
| *G06F 3/06* | (2006.01) | |
| *G06F 1/3296* | (2019.01) | |
| *G11C 7/24* | (2006.01) | |
| *G11C 13/00* | (2006.01) | |

(52) U.S. Cl.
CPC ............ *G06F 1/3296* (2013.01); *G05F 1/575* (2013.01); *G06F 3/0625* (2013.01); *G11C 5/147* (2013.01); *G11C 7/24* (2013.01); *G11C 13/0038* (2013.01); *G11C 13/0069* (2013.01); *G11C 16/10* (2013.01); *G11C 16/30* (2013.01)

(58) Field of Classification Search
CPC ...... G06F 1/3296; G06F 3/0625; G05F 1/575; G11C 16/30; G11C 5/147; G11C 16/10
See application file for complete search history.

(56) References Cited

U.S. PATENT DOCUMENTS

| | | | | |
|---|---|---|---|---|
| 7,200,066 B2* | 4/2007 | Krenzke | ................. | G11C 5/147 365/189.09 |
| 8,526,258 B2* | 9/2013 | Kim | ......................... | G11C 8/08 365/113 |
| 2012/0159207 A1* | 6/2012 | Chao | ...................... | G06F 1/3275 713/310 |
| 2017/0256314 A1* | 9/2017 | Lin | ..................... | G11C 13/0069 |

* cited by examiner

*Primary Examiner* — Tri M Hoang
(74) *Attorney, Agent, or Firm* — JCIPRNET

(57) ABSTRACT

A power circuit and a memory device using the same are provided. The power circuit is used for providing an operating voltage to a memory array, and includes a voltage regulator circuit and a voltage feedback circuit. The voltage regulator circuit receives a system voltage to provide the operating voltage. The voltage feedback circuit is coupled to the voltage regulator circuit to receive the operating voltage, and receives a data locking voltage, wherein the voltage feedback circuit has a non-volatile memory element which is set or reset in response to the data locking voltage. The voltage feedback circuit is set or reset based on the non-volatile memory element to provide a feedback voltage to the voltage regulator circuit, so as to set an output level of the operating voltage.

13 Claims, 4 Drawing Sheets

POWER CIRCUIT AND MEMORY DEVICE USING THE SAME

CROSS-REFERENCE TO RELATED APPLICATION

This application claims the priority benefit of Taiwan application serial no. 106102873, filed on Jan. 25, 2017. The entirety of the above-mentioned patent application is hereby incorporated by reference herein and made a part of this specification.

BACKGROUND OF THE INVENTION

1. Field of the Invention

The invention relates to a power circuit, and more particularly, to a power circuit and a memory device using the same.

2. Description of Related Art

Non-volatile memory has been widely used in a variety of electronic devices to store program codes required for operating electronic devices. In normal use, data can be repeatedly written in a non-volatile memory and programs in the non-volatile memory can be updated at any time. That is to say, wiring data and updating program codes are the most utilized function in the non-volatile memory.

However, if an unauthorized user takes advantage of the function for wiring data and updating programs, an operating system in the electronic device may be hacked by a remote hacker. As a result, data and program codes may be tampered easily, or data in the electronic device may be directly erased to destroy operation of the operating system. Normally, the operating system is provided with certain detection and prevention mechanism for blocking hackers. However, the prevention mechanism in the operating system belongs to a system-based operation. Therefore, the hacker may still crack the system to put the entire effort in vain even after the prevention mechanism is started.

SUMMARY OF THE INVENTION

The invention is directed to a power circuit and a memory device using the same, which can protect a non-volatile memory element from being changed when a data protection is required.

The power circuit of the invention is used for providing an operating voltage to a memory array, and includes a voltage regulator circuit and a voltage feedback circuit. The voltage regulator circuit receives a system voltage to provide the operating voltage. The voltage feedback circuit is coupled to the voltage regulator circuit to receive the operating voltage, and receives a data locking voltage, wherein the voltage feedback circuit has a non-volatile memory element which is set or reset in response to the data locking voltage. The voltage feedback circuit provides a feedback voltage to the voltage regulator circuit based on the non-volatile memory element is set or reset, so as to set an output level of the operating voltage.

The memory device of the invention includes a memory array and the power circuit as described above, wherein the power circuit is configured to provide an operating voltage to the memory array.

Based on the above, the power circuit and the memory device using the same according to the embodiments of the invention can set or reset the non-volatile memory element according to the data locking voltage, so as to regulate the output level of the operating voltage. Accordingly, when the data protection is required, the output level of the operating voltage can be regulated to be less than the write voltage level of the non-volatile memory element, so as to protect the non-volatile memory element from being changed.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
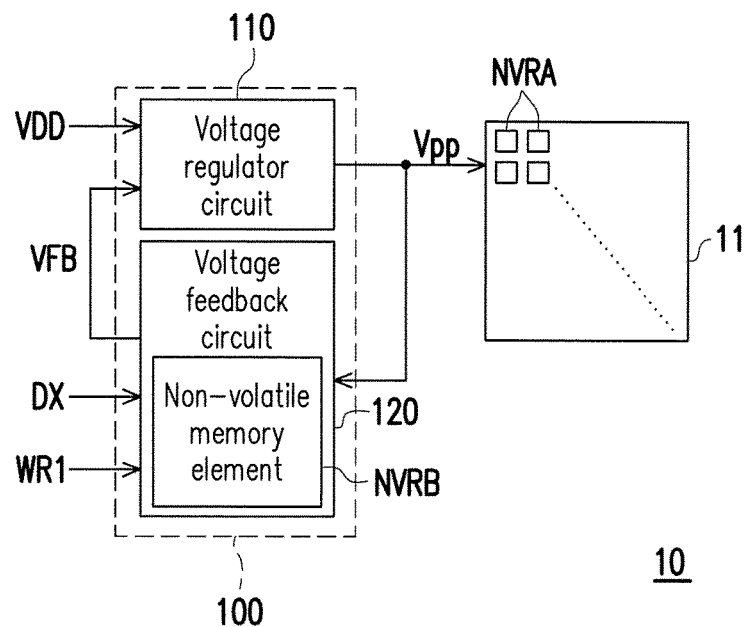
FIG. 1A is a schematic diagram showing a system of a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
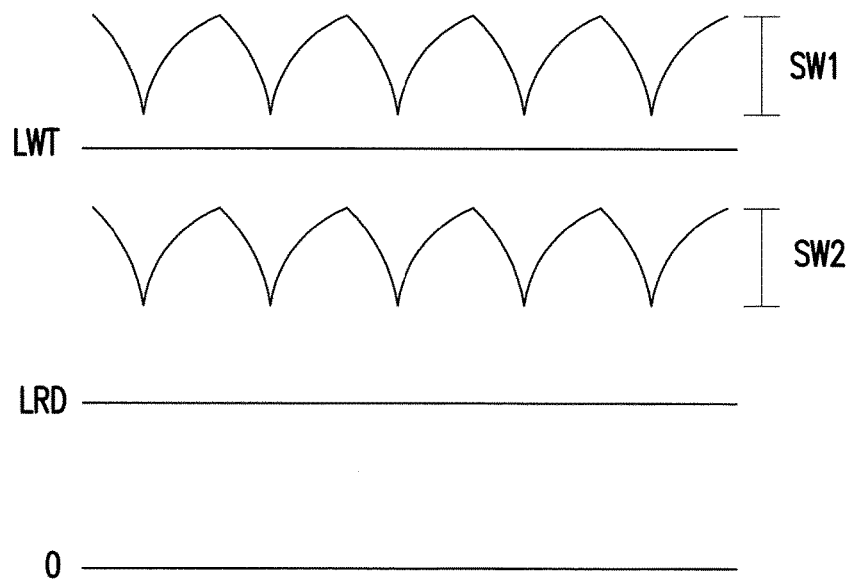
FIG. 1B is a schematic diagram showing waveforms of the operating voltage according an embodiment of the invention.

FIG. 1A is a schematic diagram showing a system of a memory device according to an embodiment of the invention. FIG. 1B is a schematic diagram showing waveforms of the operating voltage according an embodiment of the invention. Referring to FIG. 1A, in the present embodiment, a memory device 10 includes a memory array 11 and a power circuit 100. The memory array 11 has a plurality of non-volatile memory elements NVRA arranged in array. The power circuit 100 is coupled to the memory array 11, and configured to provide an operating voltage Vpp to the non-volatile memory elements NVRA of the memory array 11.

The power circuit 100 includes a voltage regulator circuit 110 and a voltage feedback circuit 120. The voltage regulator circuit 110 receives a system voltage VDD to provide the operating voltage Vpp. The voltage feedback circuit 120 is coupled to the voltage regulator circuit 110 to receive the operating voltage Vpp, and receives a data locking voltage DX and a write starting voltage WR1 (corresponding to a third write starting voltage). The voltage feedback circuit 120 has a non-volatile memory element NVRB. Here, the write starting voltage WR1 is used to determine whether the non-volatile memory element NVRB is locked, and the write starting voltage WR1 is preset to a disable state (e.g., at a high voltage level); The data locking voltage DX is used to determine whether the non-volatile memory element NVRB is in set or reset states—that is, the non-volatile memory element NVRB is set or reset in response to the data locking voltage DX—and the data locking voltage DX is preset to a disable state (e.g., at a low voltage level).

Next, the voltage feedback circuit 120 provides a feedback voltage VFB to the voltage regulator circuit 110 according to the operating voltage Vpp, so as to control the operating voltage Vpp to be maintained within a swing range. The voltage feedback circuit 120 is also based on the non-volatile memory element NVRB is set or reset to provide the feedback voltage VFB to the voltage regulator circuit 110, so as to set an output level of the operating voltage Vpp. As shown in FIG. 1B, when the non-volatile memory element NVRB is reset, the output level of the operating voltage Vpp (as shown by a swing range SW1) is greater than or equal to a write voltage level LWT of the non-volatile memory element NVRB; when the non-volatile memory element NVRB is set, the output level of the operating voltage Vpp (as shown in a swing range SW2) is less than the write voltage level LWT and greater than or equal to a read voltage level LRD.

In the present embodiment of the invention, the operating voltage Vpp received when the non-volatile memory element NVRB is set or reset may be provided by an external circuit. Also, the power circuit 100 does not include a remote control capability. In this way, the power circuit 100 cannot be unaffected by an external control circuit such as a controller of the memory array 11 (not illustrated).

According to the above, when users requires a write protection of the memory array 11, pins on the memory device 10 can be used to set the data locking voltage DX, so as to set the output level of the operating voltage Vpp to be less than the write voltage level LWT. By doing so, it can be ensured that the non-volatile memory element NVRA in the memory array 11 cannot be updated (i.e., erased and written). Further, the power circuit 100 can be designed to not include a communication capability. In this way, users can only set the states of the power circuit 100 through the pins on the memory device 10, so as to improve security on the write protection of the memory array 11.

Figure 2:
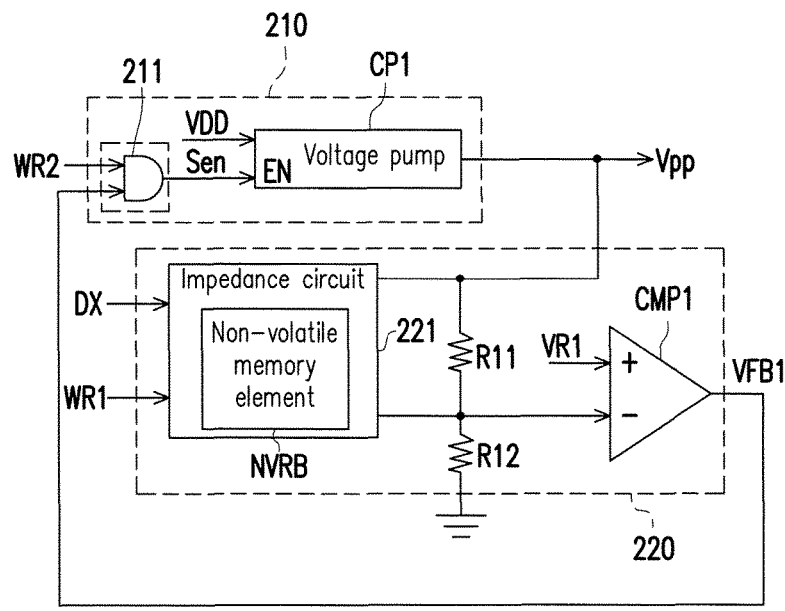
FIG. 2 is a schematic circuit diagram of a power circuit according to an embodiment of the invention.

FIG. 2 is a schematic circuit diagram of a power circuit according to an embodiment of the invention. With reference to FIGS. 1A and 2, the same or similar elements therein are indicated by the same or similar reference numbers in the drawings. In the present embodiment, a power circuit 200 includes a voltage regulator circuit 210 and a voltage feedback circuit 220, and the operating voltage Vpp is greater than the system voltage VDD.

The voltage regulator circuit 210 includes a voltage pump CP1 and a first logic circuit 211. The voltage pump CP1 has an input terminal receiving the system voltage VDD, an enable terminal EN receiving an enable signal Sen and an output terminal providing the operating voltage Vpp. The first logic circuit 211 is coupled to the voltage feedback circuit 220 to receive a feedback voltage VFB1, receives a write starting voltage WR2 (corresponding to a first write starting voltage), and is coupled to the enable terminal EN of the voltage pump CP1 to provide the enable signal Sen. According to the above, the write starting voltage WR2 is a write starting voltage provided for the non-volatile memory elements NVRA of the memory array 11, whereas the write starting voltage WR1 is a write starting voltage provided for the non-volatile memory element NVRB of the voltage feedback circuit 220. Also, the write starting voltage WR2 is definitely enabled when the write starting voltage WR1 is enabled; the write starting voltage WR1 is not necessarily enabled when the write starting voltage WR2 is enabled.

In the present embodiment, the first logic circuit 211 includes an AND gate AND1, in which one of input terminals of the AND gate AND1 receives the write starting voltage WR2, another one of the input terminals is coupled to the voltage feedback circuit 220 to receive the feedback voltage VFB1, and an output terminal of the AND gate AND1 provides the enable signal Sen.

The voltage feedback circuit 220 includes a comparator CMP1, a first resistor R11, a second resistor R12 and an impedance circuit 221. The impedance circuit 221 has the non-volatile memory element NVRB. The comparator CMP1 has a positive input terminal corresponding to a first input terminal and configured to receive a reference voltage VR1, a negative input terminal corresponding to a second input terminal, and an output terminal which provides the feedback voltage VFB1. The first resister R11 is coupled between the operating voltage Vpp and the negative input terminal of the comparator CMP1. The second resistor R12 is coupled between the negative input terminal of the comparator CMP1 and a ground voltage.

The impedance circuit 211 is connected in parallel with the first resistor R11, and receives the data locking voltage DX and the write starting voltage WR1. A resistance of the impedance circuit 221 is in response to the non-volatile memory element NVRB being set or reset, and the impedance circuit 221 sets or resets the non-volatile memory element NVRB according to the write starting voltage WR1 and the data locking voltage DX. For instance, when the non-volatile memory element NVRB is set, the resistance of the impedance circuit 221 is a low resistance (i.e., the first resistor R11 is bypassed); when the non-volatile memory element NVRB is reset, the resistance of the impedance circuit 221 is a high resistance (i.e., the first resistor R11 divides voltage with the second resistor R12).

More specifically, when the non-volatile memory element NVRB is reset, $Vpp=VR1\times(R11+R12)/R12$, where Vpp is a voltage level of the operating voltage Vpp, VR1 is a voltage level of the reference voltage VR1, R11 is a resistance of the first resistor R11, and R12 is a resistance of the second resistor R12; when the non-volatile memory element NVRB is set, $Vpp \approx VR1$. According to the above, the reference voltage VR1 can be designed to be close to the voltage level LRD but higher than the read voltage level LRD; also, a ratio of the write voltage level to the read voltage level (i.e., LWT:LRD) can be designed to be (R11+R12):R12.

In the present embodiment, the first logic circuit 211 includes, for example, the AND gate AND1. However, in other embodiments, logical circuits with same logical operation or similar function may also be used. In an embodiment of the invention, the first logic circuit 211 can be omitted. That is to say, the feedback voltage VFB1 provided by the output terminal of the comparator CMP1 can be directly transmitted to the enable terminal EN of the voltage pump CP1.

Figure 3:
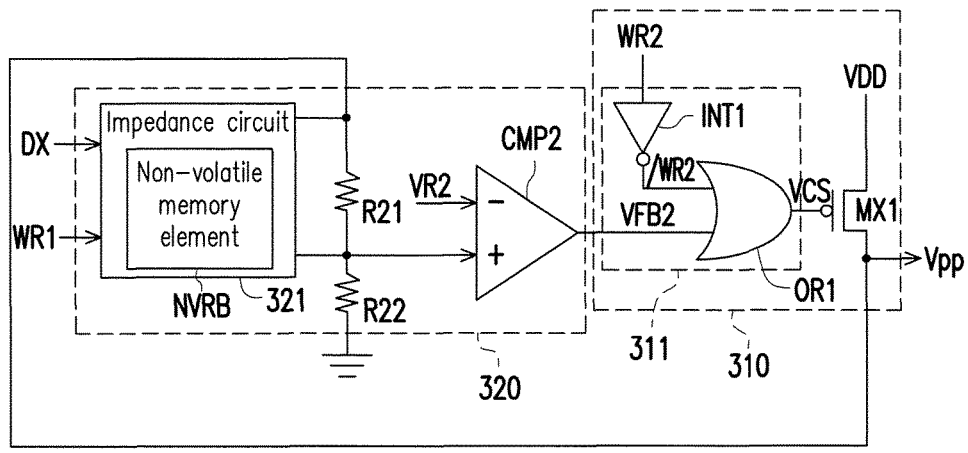
FIG. 3 is a schematic circuit diagram of a power circuit according to an embodiment of the invention.

FIG. 3 is a schematic circuit diagram of a power circuit according to an embodiment of the invention. With reference to FIGS. 1 to 3, the same or similar elements therein are indicated by the same or similar reference numbers in the drawings. In the present embodiment, a power circuit 300 includes a voltage regulator circuit 310 and a voltage feedback circuit 320, and the operating voltage Vpp is less than the system voltage VDD.

The voltage regulator circuit 310 includes a first MOS transistor MX1 and a second logic circuit 311. A source (corresponding to a first source/drain) of the first MOS transistor MX1 receives the system voltage VDD, a gate (corresponding to a first gate) of the first MOS transistor MX1 receives a control voltage VCS, and a drain (corresponding to a second source/drain) of the first MOS transistor MX1 provides the operating voltage Vpp. The second logic circuit 311 is coupled to the voltage feedback circuit 320 to receive a feedback voltage VFB2, receives a write starting voltage WR2 (corresponding to a second write starting voltage), and is coupled to the gate of the first MOS transistor MX1 to receive the control voltage VCS.

In the present embodiment, the second logic circuit 311 includes a first inverter INT1 and an OR gate OR1. An input terminal of the first inverter INT1 receives the write starting voltage WR2 and an output terminal of the first inverter INT1 provides an inverted second write starting voltage /WR2. One of input terminals of the OR gate OR1 receives the feedback voltage VFB2, another one of the input terminals of the OR gate OR1 receives the inverted write starting voltage /WR2, and an output terminal of the OR gate OR1 provides the control voltage VCS.

The voltage feedback circuit 320 includes a comparator CMP2, a first resistor R21, a second resistor R22 and an impedance circuit 321. The impedance circuit 321 has the non-volatile memory element NVRB. The comparator CMP2 has a negative input terminal corresponding to a first input terminal and configured to receive a reference voltage VR2, a positive input terminal corresponding to a second input terminal, and an output terminal which provides the feedback voltage VFB2. The first resister R21 is coupled between the operating voltage Vpp and the positive input terminal of the comparator CMP2. The second resistor R22 is coupled between the positive input terminal of the comparator CMP2 and the ground voltage.

The impedance circuit 321 is connected in parallel with the first resistor R21, and receives the data locking voltage DX and the write starting voltage WR1. A resistance of the impedance circuit 321 is in response to the non-volatile memory element NVRB being set or reset, and the impedance circuit 321 sets or resets the non-volatile memory element NVRB according to the write starting voltage WR1 and the data locking voltage DX.

In the present embodiment, the second logic circuit 311 includes, for example, the first inverter INT1 and the OR gate OR1. However, in other embodiments, logical circuits with same logical operation or similar function may also be used. In an embodiment of the invention, the second logic circuit 311 can be omitted. That is to say, the feedback voltage VFB2 provided by the output terminal of the comparator CMP2 can be directly transmitted to the gate of the first MOS transistor MX1.

Figure 4:
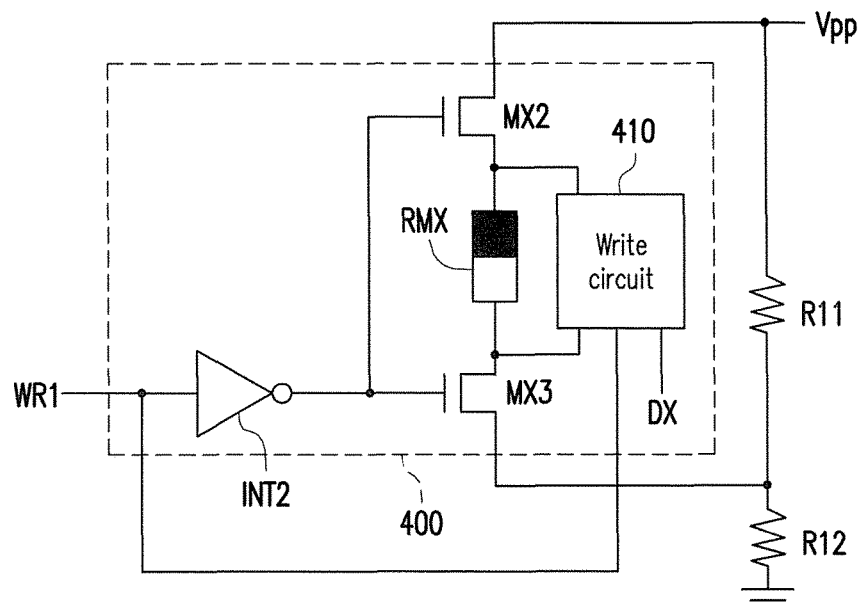
FIG. 4 is a schematic circuit diagram of an impedance circuit according to an embodiment of the invention.

FIG. 4 is a schematic circuit diagram of an impedance circuit according to an embodiment of the invention. With reference to FIG. 2 and FIG. 4, the same or similar elements therein are indicated by the same or similar reference numbers in the drawings. In the present embodiment, the non-volatile memory element NVRB is a resistive random access memory RMX, for example. Also, an impedance circuit 400 includes the resistive random access memory RMX, a second inverter INT2, a second MOS transistor MX2, a third MOS transistor MX3 and a write circuit 410.

An input terminal of the second inverter INT2 receives the write starting voltage WR1. A drain (corresponding to a third source/drain) of the second MOS transistor MX2 receives the operating voltage Vpp, a gate (corresponding to a second gate) of the second MOS transistor MX2 is coupled to an output terminal of the second inverter INT2, a source (corresponding to a fourth source/drain) of the second MOS transistor MX2 is coupled to a positive terminal of the resistive random access memory RMX. A drain (corresponding to a fifth source/drain) of the third MOS transistor MX3 is coupled to a negative terminal of the resistive random access memory RMX, a gate (corresponding to a third gate) of the third MOS transistor MX3 is coupled to the output terminal of the second inverter INT2, and a source (corresponding to a sixth source/drain) of the third MOS transistor MX3 receives the ground voltage.

The write circuit 410 is coupled to the positive terminal and the negative terminal of the resistive random access memory RMX, and receives the write starting voltage WR1 and the data locking voltage DX, so as to set or reset the resistive random access memory RMX according to the write starting voltage WR1 and the data locking voltage DX.

For instance, when the write starting voltage WR1 is disabled (e.g., at the high voltage level), the second MOS transistor MX2 and the third MOS transistor MX3 are cut off. In this case, the write circuit 410 is set to a writable mode (i.e., the write circuit 410 can set or reset the resistive random access memory RMX). When the write starting voltage WR1 is enabled (e.g., at the low voltage level), the second MOS transistor MX2 and the third MOS transistor MX3 are turned on. In this case, the write circuit 410 is set to a non-writing mode (i.e., the write circuit 410 does not set or reset the resistive random access memory RMX).

Next, when the write circuit 410 is in the writable mode and the data locking voltage DX is disabled (e.g., at the low voltage level), the write circuit 410 provides a negative voltage to the resistive random access memory RMX to reset the resistive random access memory RMX, and a resistance of the resistive random access memory RMX is a high resistance at the time; when the write circuit 410 is in the writable mode and the data locking voltage DX is enabled (e.g., at the high voltage level), the write circuit 410 provides a positive voltage to the resistive random access memory RMX to set the resistive random access memory RMX, and the resistance of the resistive random access memory RMX is a low resistance at the time.

In the present embodiment, the non-volatile memory element NVRB is a resistive random access memory RMX, for example. However, in other embodiments, other types of the non-volatile memory element NVRB can also cooperate with a MOS transistor to achieve similar functions of the resistive random access memory RMX. For instance, taking the non-volatile memory element NVRB of a voltage level type for example, a voltage stored by the non-volatile memory element NVRB can be provided to a gate of the MOS transistor so as to set a resistance of the impedance circuit (e.g., 400).

Figure 5:
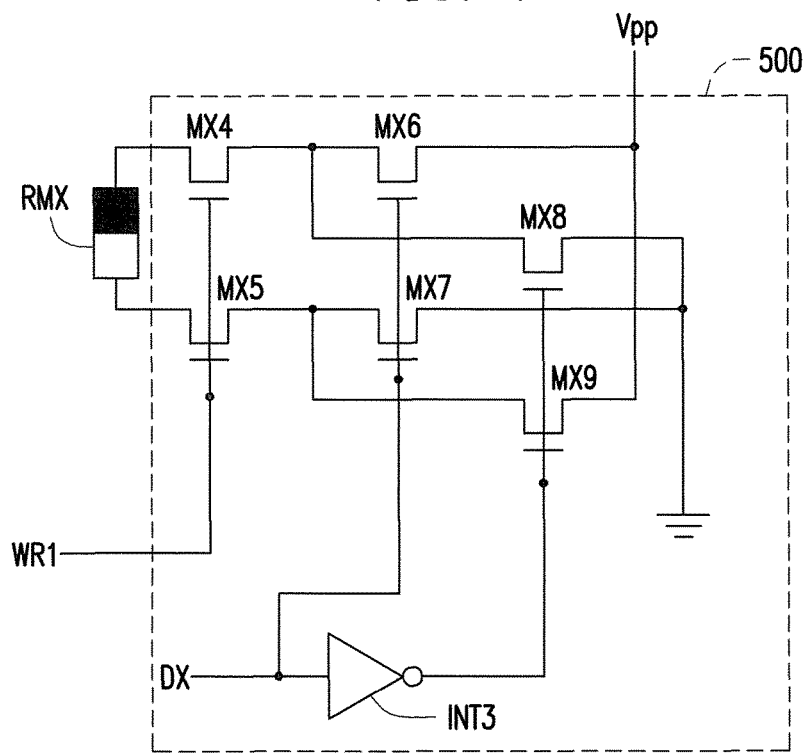
FIG. 5 is a schematic circuit diagram of a write circuit according to an embodiment of the invention.

FIG. 5 is a schematic circuit diagram of a write circuit according to an embodiment of the invention. With reference to FIG. 4 and FIG. 5, the same or similar elements therein are indicated by the same or similar reference numbers in the drawings. In the present embodiment, a write circuit 500 includes a third inverter INT3, a fourth MOS transistor MX4, a fifth MOS transistor MX5, a sixth MOS transistor MX6, a seventh MOS transistor MX7, an eighth MOS transistor MX8 and a ninth MOS transistor MX9. An input terminal of the third inverter INT3 receives the data locking voltage DX.

A drain (corresponding to a seventh source/drain) of the fourth MOS transistor MX4 is coupled to the positive terminal of the resistive random access memory RMX, and a gate (corresponding to a fourth gate) of the fourth MOS transistor MX4 receives the write starting voltage WR1. A drain (corresponding to a ninth source/drain) of the fifth MOS transistor MX5 is coupled to the negative terminal of the resistive random access memory RMX, and a gate (corresponding to a fifth gate) of the fifth MOS transistor MX5 receives the write starting voltage WR1.

A drain (corresponding to an eleventh source/drain) of the sixth MOS transistor MX6 is coupled to a source (corresponding to an eighth source/drain) of the fourth MOS transistor MX4, a gate (corresponding to a sixth gate) of the sixth MOS transistor MX6 receives the data locking voltage DX, and a source (corresponding to a twelfth source/drain) of the sixth MOS transistor MX6 receives the operating voltage Vpp. A drain (corresponding to a thirteenth source/drain) of the seventh MOS transistor MX7 is coupled to a source (corresponding to a tenth source/drain) of the fifth MOS transistor MX5, a gate (corresponding to a seventh gate) of the seventh MOS transistor MX7 receives the data locking voltage DX, and a source (corresponding to a fourteenth source/drain) of the seventh MOS transistor MX7 receives the ground voltage.

A drain (corresponding to a fifteenth source/drain) of the eighth MOS transistor MX8 is coupled to the source of the fourth MOS transistor MX4, a gate (corresponding to an eighth gate) of the eighth MOS transistor MX8 is coupled to an output terminal of the third inverter INT3, and a source (corresponding to a sixteenth source/drain) of the eighth MOS transistor MX8 receives the ground voltage. A drain (corresponding to a seventeenth source/drain) of the ninth MOS transistor MX9 is coupled to the source of the fifth MOS transistor MX5, a gate (corresponding to a ninth gate) of the ninth MOS transistor MX9 is coupled to the output terminal of the third inverter INT3, and a source (corresponding to an eighteenth source/drain) of the ninth MOS transistor MX9 receives the operating voltage Vpp.

Figure 6:
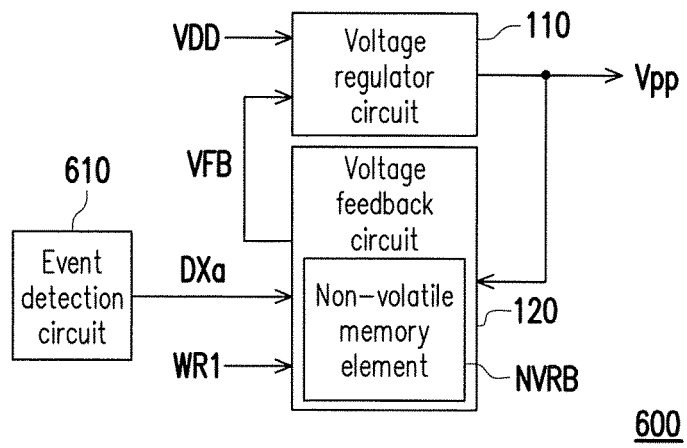
FIG. 6 is a schematic circuit diagram of a power circuit according to an embodiment of the invention.

FIG. 6 is a schematic circuit diagram of a power circuit according to an embodiment of the invention. Referring to FIG. 1A and FIG. 6, a power circuit 600 is substantially identical to the power circuit 100 but different in that that the power circuit 600 further includes an event detection circuit 610, and the same or similar elements are indicated by the same or similar reference numbers in the drawings. The event detection circuit 610 is coupled to the voltage feedback circuit 120 and configured to detect whether an event occurs and correspondingly provide a data locking voltage DXa. In other words, when the event does not occur, the event detection circuit 610 provides the disabled data locking voltage DXa (e.g., at the low voltage level), so as to reset the non-volatile memory element NVRB; when the event occurs, the event detection circuit 610 provides the enabled data locking voltage DXa (e.g., at the high voltage level), so as to set the non-volatile memory element NVRB through the data locking voltage DXa.

Aforesaid event may be circuit-type emergencies, such as sudden voltage drop or raise, or sudden current drop or raise; or network-type emergencies, such as network attack or network connection broken; or any types of emergencies, such as fire, earthquake, heavy rain, etc. Those mentioned above are merely descriptive examples, and the invention is not limited to thereto.

Figure 7:
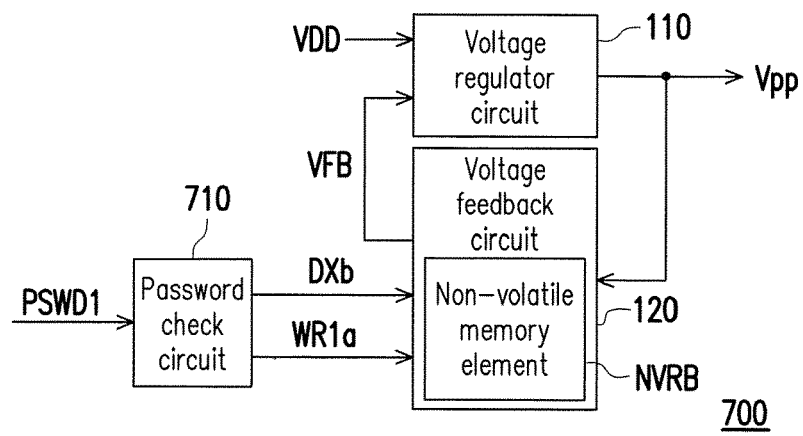
FIG. 7 is a schematic circuit diagram of a power circuit according to an embodiment of the invention.

FIG. 7 is a schematic circuit diagram of a power circuit according to an embodiment of the invention. Referring to FIG. 1A and FIG. 7, a power circuit 700 is substantially identical to the power circuit 100 but different in that that the power circuit 700 further includes a password check circuit 710, and the same or similar elements are indicated by the same or similar reference numbers in the drawings. The password check circuit 710 is coupled to the voltage feedback circuit 120 and configured to provide a write starting voltage WR1a and a data locking voltage DXb. Specifically, when receiving an input password PSWD1, the password check circuit 710 checks whether the input password PSWD1 is correct. Further, when the input password PSWD1 is correct for the first time, the write starting voltage WR1a and the data locking voltage DXb are enabled to start a data protection; when the input password PSWD1 is correct for the second time, the write starting voltage WR1a and the data locking voltage DXb are disabled to end the data protection.

In the present embodiment, the password check circuit 710 provides the write starting voltage WR1a and the data locking voltage DXb. However, in other embodiments, the password comparison circuit 710 can provide only one of the write starting voltage WR1a and the data locking voltage DXb, depending on the circuitry design, which is not particularly limited by the invention.

Figure 8:
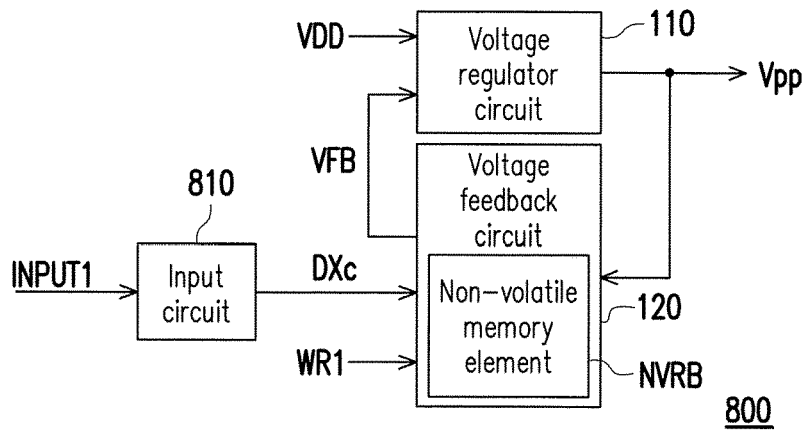
FIG. 8 is a schematic circuit diagram of a power circuit according to an embodiment of the invention.

FIG. 8 is a schematic circuit diagram of a power circuit according to an embodiment of the invention. Referring to FIG. 1A and FIG. 8, a power circuit 800 is substantially identical to the power circuit 100 but different in that that the power circuit 800 further includes an input circuit 810, and the same or similar elements are indicated by the same or similar reference numbers in the drawings. The input circuit 810 is coupled to the voltage feedback circuit 120 and receives an input signal INPUT1 to provide a data locking voltage DXc. Specifically, when the input signal INPUT1 instructs to start a data protection, the input circuit 810 can set the non-volatile memory element NVRB through the data locking voltage DXc; when the input signal INPUT1 instructs that the data protection is no longer required, the input circuit 810 can reset the non-volatile memory element NVRB through the data locking voltage DXc.

In summary, the power circuit and the memory device using the same according to the embodiments of the invention can set or reset the non-volatile memory element according to the data locking voltage, so as to regulate the output level of the operating voltage. Accordingly, when the data protection is required, the output level of the operating voltage can be regulated to be less than the write voltage level of the non-volatile memory element, so as to protect the non-volatile memory element from being changed. Also, the event detection circuit can be disposed in the power circuit to enable the data locking voltage when the event occurs. Alternatively, the password check circuit can be disposed in the power circuit to enable/disable the data locking voltage when users have entered the correct password. Furthermore, the input circuit can also be disposed in the power circuit to enable or disable the data locking voltage according to the input signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A power circuit for providing an operating voltage to a memory array, comprising:

a voltage regulator circuit configured to receive a system voltage to provide the operating voltage; and a voltage feedback circuit coupled to the voltage regulator circuit to receive the operating voltage, and configured to receive a data locking voltage, wherein the voltage feedback circuit has a non-volatile memory element which is set or reset in response to the data locking voltage, and the voltage feedback circuit provides a feedback voltage to the voltage regulator circuit based on a set state or a reset state of the non-volatile memory element, so as to set an output level of the operating voltage.

2. The power circuit according to claim 1, wherein the voltage feedback circuit comprises:

a comparator having a first input terminal configured to receive a reference voltage, a second input terminal, and an output terminal configured to provide the feedback voltage;

a first resistor coupled between the operating voltage and the second input terminal;

a second resistor coupled between the second input terminal and a ground voltage; and an impedance circuit connected in parallel with the first resistor and having the non-volatile memory element, wherein a resistance of the impedance circuit corresponds to the set state or the reset state of the non-volatile memory element.

3. The power circuit according to claim 2, wherein the voltage regulator circuit comprises:

a voltage pump having an input terminal receiving the system voltage, an enable terminal receiving an enable signal, and an output terminal providing the operating voltage; and a first logic circuit configured to receive the feedback voltage from the voltage feedback circuit, and receive a first write starting voltage, and coupled to the enable terminal to provide the enable signal.

4. The power circuit according to claim 2, wherein the voltage regulator circuit comprises:

a first MOS transistor having a first source/drain receiving the system voltage, a first gate receiving a control voltage and a second source/drain providing the operating voltage; and a second logic circuit configured to receive the feedback voltage from the voltage feedback circuit, and receive a second write starting voltage, and coupled to the first gate to provide the control voltage.

5. The power circuit according to claim 4, wherein the second logic circuit comprises:

a first inverter, having an input terminal receiving the second write starting voltage and an output terminal providing an inverted second write starting voltage;

an OR gate, wherein input terminals of the OR gate receives the feedback voltage and the inverted second write starting voltage, and an output terminal of the OR gate provides the control voltage.

6. The power circuit according to claim 2, wherein the non-volatile memory element is a resistive random access memory, the resistance of the impedance circuit is a low resistance when the resistive random access memory is in the set state, and the resistance of the impedance circuit is a high resistance when the resistive random access memory is in the reset state.

7. The power circuit according to claim 6, wherein the impedance circuit further receives a third write starting voltage, and the impedance circuit sets or resets the non-volatile memory element according to the third write starting voltage and the data locking voltage.

8. The power circuit according to claim 7, wherein the impedance circuit comprises:

the resistive random access memory, having a positive terminal and a negative terminal;

a second inverter, having an input terminal receiving the third write starting voltage and an output terminal;

a second MOS transistor, having a third source/drain receiving the operating voltage, a second gate coupled to the output terminal of the second inverter and a fourth source/drain coupled to the positive terminal;

a third MOS transistor, having a fifth source/drain coupled to the negative terminal, a third gate coupled to the output terminal of the second inverter and a sixth source/drain receiving the ground voltage; and a write circuit, coupled to the positive terminal and the negative terminal, and receiving the third write starting voltage and the data locking voltage, so as to set or reset the resistive random access memory according to the third write starting voltage and the data locking voltage.

9. The power circuit according to claim 8, wherein the write circuit comprises:

a fourth MOS transistor, having a seventh source/drain coupled to the positive terminal, a fourth gate receiving the third write starting voltage and an eighth source/drain;

a fifth MOS transistor, having a ninth source/drain coupled to the negative terminal, a fifth gate receiving the third write starting voltage and a tenth source/drain;

a sixth MOS transistor, having an eleventh source/drain coupled to the eighth source/drain, a sixth gate receiving the data locking voltage and a twelfth source/drain receiving the operating voltage;

a seventh MOS transistor, having a thirteenth source/drain coupled to the tenth source/drain, a seventh gate receiving the data locking voltage and a fourteenth source/drain receiving the ground voltage;

a third inverter, having an input terminal receiving the data locking voltage and an output terminal;

an eighth MOS transistor, having a fifteenth source/drain coupled to the eighth source/drain, an eighth gate coupled to the output terminal of the third inverter and a sixteenth source/drain receiving the ground voltage; and a ninth MOS transistor, having a seventeenth source/drain coupled to the tenth source/drain, a ninth gate coupled to the output terminal of the third inverter and an eighteenth source/drain receiving the operating voltage.

10. The power circuit according to claim 9, further comprising: a password check circuit configured to provide the third write starting voltage, wherein when receiving an input password, the password check circuit checks the input password, and then enables the third write starting voltage when the input password is correct.

11. The power circuit according to claim 1, wherein the output level of the operating voltage is greater than or equal to a write voltage level when the non-volatile memory element is in the reset state, and the output level of the operating voltage is less than the write voltage level and greater than or equal to a read voltage level when the non-volatile memory element is in the set state.

12. The power circuit according to claim 1, further comprising: an event detection circuit, configured to detect whether an event occurs, correspondingly provide the data locking voltage, and set the non-volatile memory element through the data locking voltage when the event occurs.

13. A memory device, comprising:
a memory array; and
the power circuit according to claim 1, configured to provide an operating voltage to the memory array.

* * * * *